United States Patent [19]

Nambu et al.

[11] Patent Number: 4,777,520

[45] Date of Patent: Oct. 11, 1988

[54] HEAT-RESISTANT PLASTIC SEMICONDUCTOR DEVICE

[75] Inventors: Seigo Nambu; Shinji Takei; Hiroshi Okuaki, all of Tokyo, Japan

[73] Assignee: Oki Electric Industry Co. Ltd., Tokyo, Japan

[21] Appl. No.: 24,795

[22] Filed: Mar. 11, 1987

[30] Foreign Application Priority Data

Mar. 27, 1986 [JP] Japan .................................. 61-67143

[51] Int. Cl.[4] ............................................. H01L 21/56
[52] U.S. Cl. ................................... 357/72; 174/52 FP; 174/52 PE; 357/70
[58] Field of Search .......... 357/72; 174/52 PE, 52 FP

[56] References Cited

FOREIGN PATENT DOCUMENTS

| | | | |
|---|---|---|---|
| 54-111768 | 1/1979 | Japan | 357/72 |
| 59-22349 | 2/1984 | Japan | 357/72 |
| 60-208847 | 10/1985 | Japan | 357/72 |
| 61-23348 | 1/1986 | Japan | 357/72 |
| 61-78150 | 4/1986 | Japan | 357/72 |

Primary Examiner—R. R. Kucia
Attorney, Agent, or Firm—Spencer & Frank

[57] ABSTRACT

A heat-resistant plastic-packaged semiconductor device comprises an IC chip having contacts on its first surface, an island on which the IC chip is mounted with its second surface facing a first surface of the island, a low-adhesion layer which is formed on a second surface of the island, external leads, bonding wires for connection of the contacts on the IC chip and inner ends of the external leads, a package of mold resin for encapsulating the IC chip, the low-adhesion layer, the bonding wires and inner parts of the external leads, the mold resin being provided with a vent hole which extends to the vicinity of the low-adhesion layer. The low-adhesion layer has a low or no adhesive power to the mold resin.

8 Claims, 5 Drawing Sheets

PRIOR ART FIG. 7b    FIG. 7c PRIOR ART

HEAT-RESISTANT PLASTIC SEMICONDUCTOR DEVICE

BACKGROUND OF THE INVENTION

This invention relates to a heat-resistant plastic semiconductor device, in particular to a heat-resistant plastic semiconductor device using a flat package, possessing high heat and humidity resistance, and intended for high-density mounting.

As electronic devices are made to perform increasingly many functions and to process increasingly large quantities of information at increasingly high speeds, so-called flat ICs (integrated circuits) using flat plastic packages (FPPs) which are advantageous for high-density surface mounting, automated mounting, etc. on printed circuit boards have been widely adopted for large-scale integrated circuits and other semiconductor devices.

FIG. 3 shows a flat IC, and FIG. 4 shows a cross section through the line B—B. FIG. 4a shows the case in which a junction coating resin (JCR) is not used, while FIG. 4b shows the case in which a JCR is used. In the case of FIG. 3 and FIG. 4a, first the IC chip 23 is die-bonded on an island 22 supported by island supports, then the external leads 21 and the IC chip 23 are wire-bonded with gold wire 24, and the structure is sealed or encapsulated by a mold resin 25. In the case of FIG. 4b, after the bonding of the gold wires 24, the surface of the IC chip 23 is coated with JCR 26 to improve the resistance to humidity.

As shown in FIG. 5, one conventional method of mounting a flat IC 29 having the above structure on a printed circuit board 27 is a partial-heating soldering method, in which only the leads are heated by a soldering iron 30. Recently another method has often been used for items intended for mass production, in which the entire package is heated. Specifically, as shown in FIG. 6a, solder paste is applied to the printed circuit board 27, the flat IC 29 is placed on the printed circuit board 27, then the heating is performed by such means as hot air or near- or far-infrared radiation. Another method, shown in FIG. 6b, is to apply an adhesive 31 to the printed circuit board 27, followed by placing the flat IC 29 on the adhesive 31, thereby attaching it to the printed circuit board 27, and then dipping the assembly in a solder bath.

When the above soldering method of heating the entire package is employed and the pckage is exposed to temperatures in excess of 200° C., moisture that has penetrated the package while the device was left for about a week or more in ambient conditions of 23° C. and 60% RH (relative humidity) vaporizes, generating great stress acting from the inside of the package toward the outside. In addition, the strength of the mold resin is reduced to nearly 0 kg/cm² to 0.1 kg/cm² for example. Since the IC chip is hermetically sealed, the vapor cannot easily escape to the outside. The result is that the flat IC, particularly one having a thin mold, swells up like a balloon, eventually causing cracks in the upper or lower surface of the mold resin 25 which seriously degrade the visual appearance of the device as shown at A and B in FIG. 7a showing a cross-sectional view of a flat IC 29 with such a visual defect, FIG. 7b showing a top view and FIG. 7c showing a bottom view.

If such a flat IC 29 with a crack is used the gold wire may break at the location of the crack. Moreover, moisture can easily enter at the crack, penetrate to the IC chip 23, and corrode the aluminum interconnections on its surface, eventually causing open circuits that prevent the IC from performing its function.

SUMMARY OF THE INVENTION

An object of this invention is to provide a heat-resistant plastic semiconductor device that permits easy escape of vaporized moisture and posesses excellent resistance to humidity.

According to the invention, there is provided a heat-resistant plastic-packaged semiconductor device comprising an IC chip having contacts on its first surface, an island on which the IC chip is mounted with its second surface facing a first surface of the island, a low-adhesion layer which is formed on a second surface of the island, external leads, bonding wires for connecting the contacts on the IC chip and inner ends of the external leads, a package of mold resin for encapsulating the IC chip, the island, the low-adhesion layer, the bonding wires and inner parts of the external leads, the mold resin being provided with a vent hole which extends to the vicinity of the low adhesion layer, the low-adhesion layer having a low or no adhesive power to the mold resin.

In the configuration employed in this invention as described above, the adhesion at the interface between the mold resin of the package and the low-adhesion layer is reduced, so that when the device is soldered by the method of heating the entire package, moisture that has been absorbed inside the mold resin can easily escape as vapor through the above interface and vent hole to the outside of the package. Internal stress resulting from water vapor pressure inside the package is thereby sufficiently reduced, and hence cracking of the package is avoided.

Where the IC chip mounted in the package is covered by a chip coat capable at least of preventing the penetration of corrosive impurity ions from the mold resin, no corrosion will be induced. The chip coat also serves to reduce thermal stress on the IC chip during the soldering process.

BRIEF DESCRIPTION OF THE DRAWINGS

In the accompanying drawings:

FIG. 4 shows a cross section through the line B—B in FIG. 3;

FIG. 4a shows the case in which a junction coating resin (JCR) is not used, while

FIG. 6a shows the method with adhesive; and FIG. 7 is a sketch indicating defects of the prior art;

FIG. 7a shows a defect in cross section, while FIGS. 7b and 7c show top and bottom views, respectively.

DESCRIPTION OF THE PREFERRED EMBODIMENTS

Figure 1A:
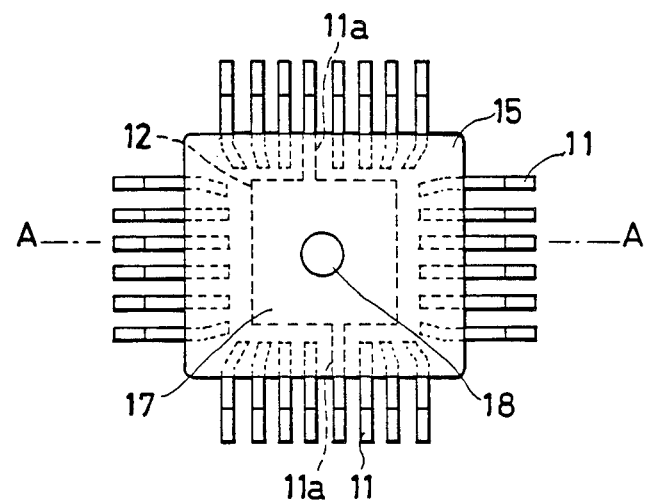
FIG. 1a is a bottom view showing a semiconductor device of an embodiment of the invention.
Figure 1B:
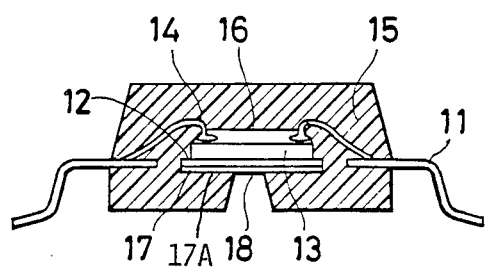
FIG. 1b is a cross section through the line A—A in FIG. 1a, FIG. 2a is a cross section showing the flash layer in the vent.

An embodiment of this invention will be described with reference to FIGS. 1 and 2. In FIGS. 1 and 2, reference numerals 11 and 12 respectively denote external leads and an island forming a lead frame (a 42-alloy lead frame). Reference numeral 13 denotes an IC chip die-bonded to this island 12. Reference numeral 14 denotes a thin metal wire consisting of gold wire that is wire-bonded to connect a contact on the surface of the IC chip 13 to an external lead 11. Reference numeral 11a denotes island supports.

Reference numeral 17 denotes a low-adhesion layer, which is a layer of gold plated to the undersurface of the island 12; that is, to the opposite surface from the surface on which the IC chip 13 is mounted. Where the low-adhesion layer consists of gold plating, its surface is passive, so that it adheres only weakly to mold resin 15, which for example is an epoxy resin.

Reference numeral 18 is a vent hole, which leads from the bottom of the package to the above low-adhesion layer 17. The vent hole may have the structure described on pages 73 to 78 of Oki Denki Kenkyu Kaihatsu 128 Vol. 52 No. 4. For example, it can be given a circular shape by the forming die.

Because of the low-adhesion layer 17 and vent hole 18 on the underside of the package, during soldering processes at temperatures exceeding 200° C. water vapor is not trapped inside the package but is vented through the interface 17A between the low-adhesion layer 17 and the mold resin 15, and the vent hole 18 to the outside, which minimizes deformation of the package after heating. For protection from moisture, to which the interface between the low-adhesion layer 17 and mold resin 15 affords a relatively easy entry, and for the purpose of reducing the stress which the mold resin 15 produces on the IC chip 13 due to thermal hysteresis, a chip coat 16 consisting of a silicone resin having a high-adhesion to the surface of the IC chip 13 is applied to the surface of the IC chip 13. The chip coat 16 also serves to prevent the penetration of corrosive impurity ions, such as chlorine (Cl) ions and sodium (Na) ions, from the mold resin, thereby to prevent corrosion of the contacts and interconnections on the surface of the IC chip. The chip coat 16 has additional functions of preventing soft error due to alpha particles (where the semiconductor device is or contains a memory).

Figure 2A:
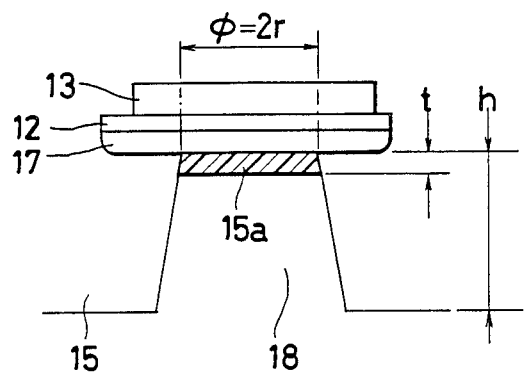
FIG. 2b shows characteristics showing the maximum allowable thickness of the flash.
Figure 2B:
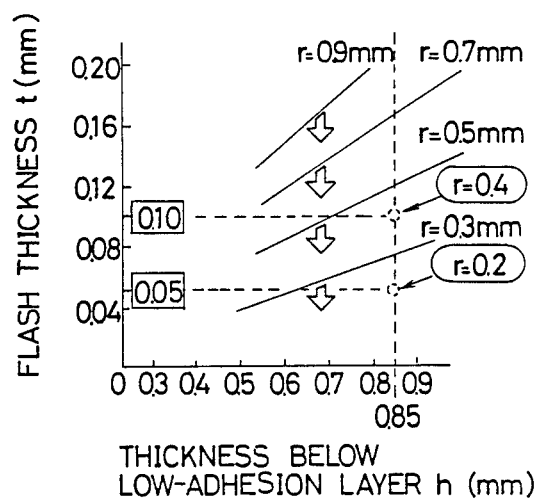
Figure 3:
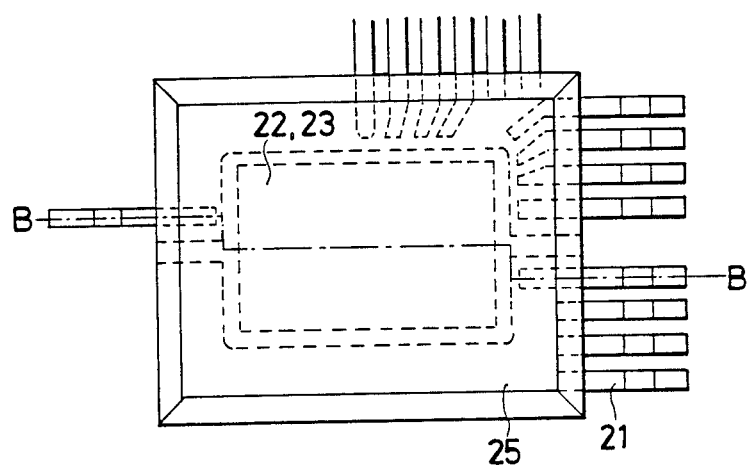
FIG. 3 is a top view showing part of the prior art semiconductor device.
Figure 4A:
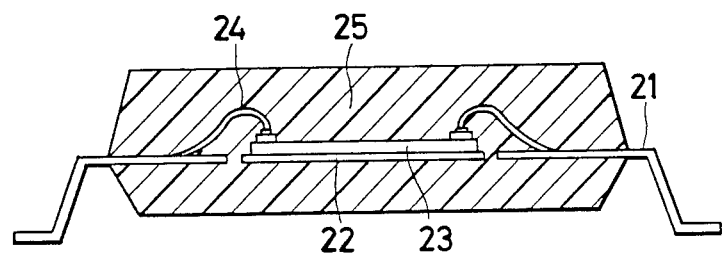
Figure 4B:
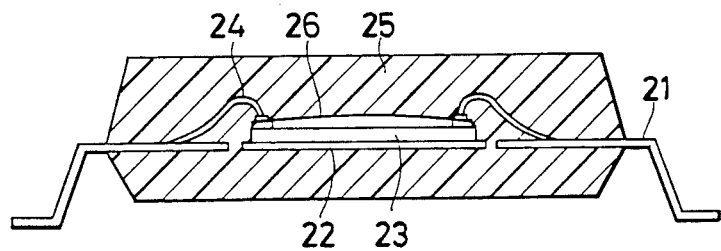
FIG. 4b shows the case in which a JCR is used.
Figure 5:
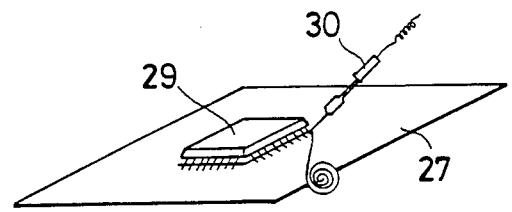
FIG. 5 is a sketch showing the partial-heating method of attaching a flat IC.
Figure 6A:
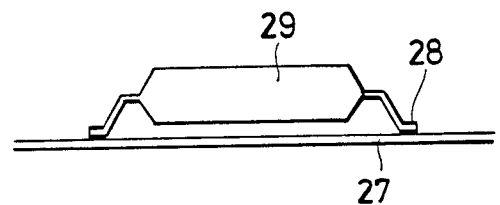
FIG. 6a shows the method without adhesive.
Figure 6B:
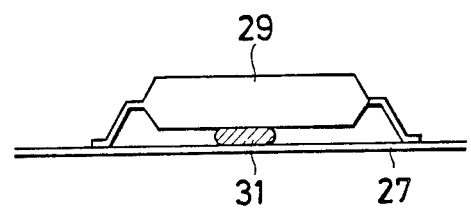
FIG. 6 is a sketch of the method in which the entire package is heated to attach a flat IC.
Figure 7A:
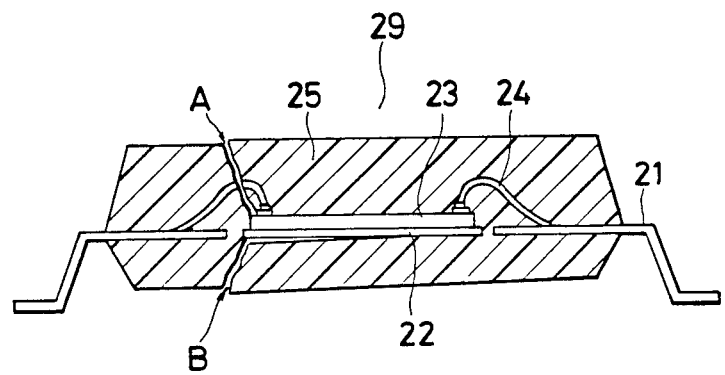
Figure 7A:
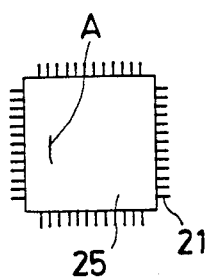
Figure 7A:
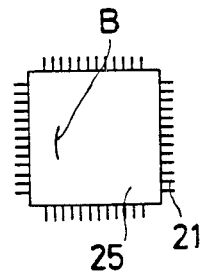

As shown in FIG. 2a, there can be a thin layer of flash 15a between the low-adhesion layer 17 and the vent hole 18. In this drawing r denotes the radius of the vent hole, h denotes the thickness of the mold resin 15 below the low-adhesion layer, and t denotes the thickness of the flash. The maximum thickness enabling the flash to break first during soldering is given in FIG. 2b with the radius r of the vent hole as a parameter. For a given vent hole radius r, if the thickness value lies below the straight line in the region indicated by the arrow, cracks will occur in the flash 15a first, avoiding cracking of the package.

If the diameter 2 r of the vent hole is 1.0 mm and the thickness of the flash 15a is 0.1 mm, swelling or cracking occurs with some sealing materials, but when the thickness h below the low-adhesion layer is around 0.85 mm the swellings or cracks do not occur, so a wider range of sealing materials is available for selection.

With the configuration described above, a heat-resistant plastic-packaged semiconductor device using a flat package can be formed. The low-adhesion layer 17 in this embodiment was a layer of gold plating, but nickel (Ni), chromium (Cr), cobalt (Co) and other plating materials which has passivity on the outer surface, or on the surface of which an oxide film having passivity is formed, could also be used. Still alternatively, a fluorocarbon resin (product name: Teflon), silicone resin, or other substance having a low adhesion to the mold resin could be used.

The area covered by the low adhesion layer 17 can be the entirety of the undersurface of the island 12, or the part corresponding to the vent hole 18. Alternatively, the low-adhesion layer 17 can be extended to cover part or all of the island supports 11a to permit even easier escape of water vapor. A copper lead frame may be used instead of a 42-alloy lead frame, but still the low-adhesion layer 17 can be formed on it.

The vent hole 18 need not be circular; a polygonal shape can also be used. As long as the hole is small, its shape is unrestricted. For the chip coat 16, instead of the silicone resin given above, a polyimide resin can also be used.

Although in the embodiment described, the chip coat is provided to prevent penetration of impurity ions from the mold resin, the chip coat may be eliminated where a mold resin which does not contain corrosive impurities is used.

Although a flat package was described above, this invention can also be applied to various other types of resin-sealed packages, e.g., with dual in-line pin (DIP) structures.

Results of high-temperature tests of heat-resistant plastic semiconductor devices embodying the present invention are shown in Table 1. The specimens tested had a 44-pin flat package with a flash thickness of t=0, 0.1 and a vent hole diameter of 2 r=1 mm. They were allowed to absorb moisture for 72 hours under conditions of 85 C and 85% RH, and were heat-processed in an infrared reflow chamber at a temperature of 245° C. on the package surface.

TABLE 1

| Low-adhesion layer | Number of specimens that cracked/ Number of specimens tested | |
|---|---|---|
| | t = 0 | t = 0.1 |
| Au plate | 0/20 | 0/20 |
| Ni plate | 0/20 | 0/20 |
| Unplated | 4/20 | 7/20 |

As the Table 1 indicates, test results of this invention were extremely favorable.

Because in this invention a low-adhesion layer is formed on at least part of the undersurface of the island and a vent hole is provided at the corresponding location in the bottom of the package as explained in the detailed description, during high-temperature processes such as soldering, vapor from absorbed moisture can escape to the outside via the interface between the low-adhesion layer and the mold resin, and the vent hole. The result is a reduction in internal stress due to water vapor pressure, so that cracking of the package is avoided; thus the resistance of the device to heat is improved.

Where the surface of the IC chip is covered with a chip coat capable at least of preventing the penetration of impurity ions, ions of impurities from the outside are prevented from reaching the chip surface, so that, in conjunction with the avoidance of cracks as described above, the resistance of the device to humidity is improved.

Results of humidity-resistant tests of heat-resistant plastic semiconductor devices embodying the present invention are shown in Table 2. The humidity-resistance tests, called pressure cooker tests (PCTs), were conducted at a temperature of 121° C. and at a relative humidity of 100% RH, and at a pressure of 2 atms. The devices tested were of 44 pin package having a flash thickness of t=0.1 mm, a vent hole diameter 2 r=1 mm. Prior to this test, the devices were placed in the condition for moisture absorption at a temperature of 85° C. and at a humidity of 85% RH for 72 hours, and then heated in an infrared reflow oven raising the temperature on the surface of the package to 245° C. In Table 2, the PCT columns indicate the time (hours) during which the devices were subjected to the Pressure Cooker Test (i.e., either 500 or 1000 hours).

The failures which occured when there was no chip coat were contact failure due to Al corrosion at the bonding pads. Table 2 indicates that the provision of the chip coat improves the humidity resistance of the semiconductor device.

TABLE 2

| Low-adhesion layer | Number of specimens that cracked/ Number of specimens tested | | | |
|---|---|---|---|---|
| | Without chip coat | | With chip coat | |
| | PCT 500H | PCT 1000H | PCT 500H | PCT 1000H |
| Au Plate | 0/22 | 1/22 | 0/22 | 0/22 |
| Ni Plate | 0/22 | 1/22 | 0/22 | 0/22 |
| Unplated | 1/22 | 3/21 | 0/22 | 0/22 |

The present invention thus yields a highly-reliable, heat-resistant plastic semiconductor device.

What is claimed is:

1. A heat-resistant plastic-packaged semiconductor device capable of releasing a quantity of thermally expanded vapor resulting from penetration of water from a humid environment and a subsequent application of heat, comprising an integrated circuit chip having first and second surfaces, said chip having contacts on said first surface;

an integrated circuit lead frame including external leads and an island on which the integrated circuit chip is mounted with said second surface facing a first surface of the island;

a low-adhesion layer formed on a second surface of the island, said low-adhesion layer being formed of at least one element from the group consisting of Au, Ni, Cr, and Co;

bonding wires for connecting the contacts on the integrated circuit chip and inner ends of the external leads;

a package of epoxy resin for encapsulating the integrated circuit chip, the island, the low-adhesion layer, the bonding wires and inner ends of the external leads, said epoxy resin being provided with a vent hole which extends to the vicinity of said low-adhesion layer thereby exposing the surface of the low-adhesion layer to allow said thermally expanded vapor to be released from around the integrated circuit chip during subsequent heating, said low-adhesion layer adhering weakly to said epoxy resin.

2. A device according to claim 1, wherein the first surface of the integrated circuit chip is coated with a chip coat capable at least of preventing penetration of corrosive impurity ions from the epoxy resin.

3. A device according to claim 2, wherein the chip coat is formed of silicone resin, or polyimide resin.

4. A device according to claim 2, wherein the chip coat is formed to cover the contacts on the integrated circuit chip and parts of the bonding wires bonded to the contacts.

5. A device according to claim 1, wherein the vent hole extends vertically with respect to the island.

6. A device according to claim 1, wherein the vent hole is formed in that part of the epoxy resin which covers the low-adhesion layer.

7. A device according to claim 1, wherein the thickness of the epoxy resin remaining at the bottom of the vent hole is so small that the epoxy resin remaining at the bottom breaks before the rest of the epoxy resin during application of heat after penetration of water in the package.

8. A device according to claim 1, wherein the vent hole has a diameter of about 1 mm.

* * * * *